(12) United States Patent
Lee (10) Patent No.: US 7,939,410 B2
(45) Date of Patent: May 10, 2011

(54) SEMICONDUCTOR DEVICE AND MANUFACTURING METHOD THEREOF

(75) Inventor: Sang Seop Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 233 days.

(21) Appl. No.: 12/341,775

(22) Filed: Dec. 22, 2008

(65) Prior Publication Data

US 2009/0166733 A1     Jul. 2, 2009

(30) Foreign Application Priority Data

Dec. 28, 2007   (KR) ........................ 10-2007-0140015

(51) Int. Cl.
*H01L 21/336* (2006.01)
(52) U.S. Cl. ............... 438/270; 438/589; 257/E21.41; 257/E21.419; 257/E21.42
(58) Field of Classification Search ............. 438/270, 438/589, FOR. 192, FOR. 162; 257/E21.41, 257/E21.419, E21.42
See application file for complete search history.

(56) References Cited

U.S. PATENT DOCUMENTS

| | | | | |
|---|---|---|---|---|
| 6,620,669 | B2* | 9/2003 | Hijzen et al. | 438/206 |
| 7,323,386 | B2* | 1/2008 | Yilmaz | 438/268 |
| 7,476,589 | B2* | 1/2009 | Grebs et al. | 438/270 |
| 7,592,650 | B2  | 9/2009 | Hshieh | |
| 7,622,768 | B2* | 11/2009 | Aoki et al. | 257/330 |
| 2006/0054970 | A1 | 3/2006 | Yanagida et al. | |
| 2006/0273380 | A1 | 12/2006 | Hshieh | |

(Continued)

FOREIGN PATENT DOCUMENTS

CN     1929149 A     3/2007

(Continued)

OTHER PUBLICATIONS

Fwu-luan Hshieh; "Source Contact and Metal Scheme for High Density Trench Mosfet"; espacenet; Chinese Publication No. CN1929149 (A); Publication Date: Mar. 14, 2007; espacenet Database—Worldwide, http://v3.espacenet.com/publicationDetails/biblio?DB=EPODOC&adjacent=true&locale=....

(Continued)

*Primary Examiner* — George Fourson
(74) *Attorney, Agent, or Firm* — The Law Offices of Andrew D. Fortney; Andrew D. Fortney (57) ABSTRACT

A method of manufacturing a semiconductor device including forming a first conductive-type buried layer in a substrate; forming a first conductive-type drift area on the first conductive-type buried layer; forming a gate insulating layer and gate electrodes by selectively removing the first conductive-type drift area; forming a first oxide layer on the substrate and gate electrodes; implanting second conductive-type impurity ions into the substrate; forming a nitride layer on the first oxide layer; forming a second conductive-type well by diffusing the second conductive-type impurity ions while forming a second oxide layer; removing the nitride layer, the second oxide layer, and portions of the first oxide layer; forming first conductive-type source areas at sides of the gate electrode(s); forming a dielectric layer on the oxide layer; forming a trench in the dielectric layer and the oxide layer; forming a source contact in the trench; and forming a drain.

12 Claims, 6 Drawing Sheets

U.S. PATENT DOCUMENTS

| | | | |
|---|---|---|---|
| 2006/0273382 A1 | 12/2006 | Hshieh | |
| 2006/0273383 A1 | 12/2006 | Hshieh | |
| 2006/0273384 A1 | 12/2006 | Hshieh | |
| 2006/0273385 A1 | 12/2006 | Hshieh | |
| 2006/0273390 A1 | 12/2006 | Hshieh et al. | |
| 2007/0004116 A1 | 1/2007 | Hshieh | |
| 2007/0166905 A1 | 7/2007 | Yanagida et al. | |
| 2009/0166733 A1* | 7/2009 | Lee | 257/330 |
| 2010/0123190 A1* | 5/2010 | Kim | 257/330 |
| 2010/0244125 A1* | 9/2010 | Sonsky et al. | 257/330 |

FOREIGN PATENT DOCUMENTS

| | | | |
|---|---|---|---|
| KR | 1020060050926 B1 | 5/2006 | |

OTHER PUBLICATIONS

Partial Chinese Office Action date stamped Dec. 11, 2009; Chinese Patent Application No. 2008101895390; 1pg; The State Intellectual Property Office of P.R.C., People's Republic of China.

Masmichi Yanagida, Hirotoshi Kubo, Junichiro Tojo, Hiroaki Saito, Masahito Onda; "Semiconductor Device and Fabricating Method Thereof to Form Channel Layer of Essentially Minimun Depth"; Korean Patent Abstracts; Publication No. 1020060050926 A; Publication Date: May 19, 2006; Korean Intellectual Property Office, Republic of Korea.

Korean Office Action dated Jun. 18, 2009; Korean Patent Application No. 10-2007-0140015; Korean Intellectual Property Office, Republic of Korea.

* cited by examiner

SEMICONDUCTOR DEVICE AND MANUFACTURING METHOD THEREOF

The present application claims priority under 35 U.S.C. §119(e) to Korean Patent Application No. 10-2007-0140015 (filed on Dec. 28, 2007), which is hereby incorporated by reference in its entirety.

BACKGROUND

Embodiments of the present invention relate to a semiconductor device and a manufacturing method thereof.

A semiconductor device, such as a power transistor, generally has a source area formed on a semiconductor substrate and a drain area formed below the source area so that a channel is formed in a vertical direction. The device (e.g., power transistor) has a structure including a gate electrode filled in a trench formed in the semiconductor substrate.

In general, if the thickness of an oxide layer formed on the gate electrode is too great, the thick oxide layer may negatively affect the performance of the semiconductor device (e.g., power transistor). The oxide layer may be grown during a heat treatment process for an ESD (Electrostatic Discharge) protective circuit and a dopant diffusion process so that the oxide layer has thickness of about 580±40 Å.

However, in general, the oxide layer formed on the gate electrode should have thickness of about 180±30 Å to have a positive effect upon performance of the device. When a thick oxide layer (e.g., 580±40 Å) is subsequently etched, defects may be generated due to over-etching.

For example, if the oxide layer has thickness of about 580 Å, the oxide layer must be removed by thickness of about 400 Å (e.g., by etching with a mixture of DIW [deionized water] and HF). At this time, a deviation of about ±40 Å may occur.

Thus, the oxide layer may be over-etched or under-etched, causing problems with the performance of the device.

SUMMARY

Embodiments of the present invention provide a semiconductor device and manufacturing methods thereof.

One embodiment of the present invention provides a method of manufacturing a semiconductor device, which can efficiently control the thickness of an oxide layer formed on a gate electrode in or on a semiconductor substrate in a device such as a power transistor. In the present method, power may be applied to the semiconductor device such that a channel is vertically formed between a source area and a drain electrode layer so that electrons can move through the structure.

The present method of manufacturing a semiconductor device includes the steps of forming a first conductive-type buried layer in a semiconductor substrate and forming a first conductive-type drift area on the first conductive-type buried layer, forming a gate insulating layer and gate electrodes by selectively removing portions of the first conductive-type drift area, forming a first oxide layer on the semiconductor substrate including the gate electrodes, implanting second conductive-type impurity ions into the semiconductor substrate including the first oxide layer, forming a nitride layer on the first oxide layer, forming a second conductive-type well by diffusing the second conductive-type impurity ions and simultaneously forming a second oxide layer on the nitride layer, removing the nitride layer and the second oxide layer from the first oxide layer, forming a thin oxide layer by partially removing the first oxide layer, forming first conductive-type source areas at sides of each gate electrode, forming a dielectric layer on the thin oxide layer, forming a trench by selectively etching the dielectric layer and the thin oxide layer, forming a source contact in the trench, and forming a drain electrode layer electrically connected with the first conductive-type buried layer.

Another embodiment of the present invention comprises a semiconductor device including a semiconductor substrate, the substrate including a drain electrode layer, a first conductive-type buried layer on the drain electrode layer, a first conductive-type drift area on the first conductive-type buried layer, and a second conductive-type well on the first conductive-type drift area, a gate insulating layer and a gate electrode in a trench in the first conductive-type drift area and the second conductive-type well, source areas at sides of the gate electrode, an oxide layer and a dielectric layer on the semiconductor substrate, including the source areas and the gate electrode, a second trench in the dielectric layer, the oxide layer and the second conductive-type well, a barrier layer on the trench and the dielectric layer, and a source contact in the barrier layer.

DETAILED DESCRIPTION OF THE EMBODIMENTS

Hereinafter, a semiconductor device and a method of manufacturing the same according to embodiments of the present invention will be described with reference to the accompanying drawings.

Figure 18:
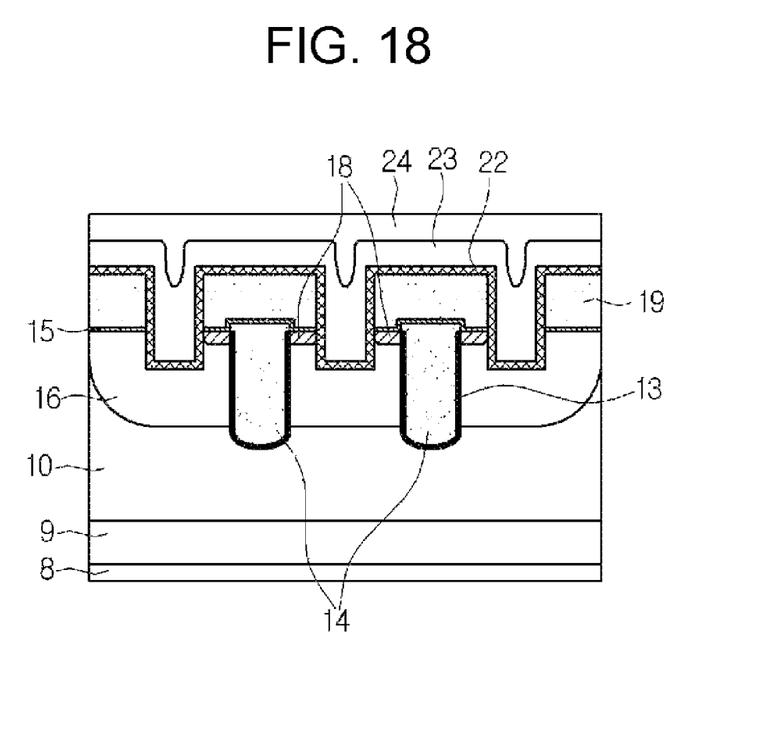

FIG. 18 is a cross-sectional view illustrating a semiconductor device according to the present invention.

Referring to FIG. 18, a first conductive-type buried layer 9 and a first conductive-type drift area 10 are formed in a semiconductor substrate, and a second conductive-type well 16 is formed in the first conductive-type drift area 10.

Next, a gate insulating layer 13 and at least one gate electrode 14 is formed in an area from which the first conductive-type drift area 10 and the second conductive-type well 16 are selectively removed (e.g., a first trench in the substrate), and first conductive-type source areas 18 are formed at opposite sides of each gate electrode 14. In some embodiments, the gate electrode may protrude outward from the first trench or via.

Then, an oxide layer 15 and an interlayer dielectric layer 19 are formed on the gate electrodes 14 and the first conductive-type source areas 18.

A second trench may be formed by partially etching the interlayer dielectric layer 19 and portions of the second conductive-type well 16 on at least one side (and preferably on opposite sides) of the first conductive-type source areas 18. A barrier layer 22 is formed on the entire surface of the semiconductor substrate including the second trench(es).

Then, the second trench is filled with a conductive material 23 forming at least one source contact. In some embodiments, one or more metal layers may be used to form the source contact(s). For example, tungsten 23 and aluminum 24 may be used as the conductive material(s) for the source contacts. In such embodiments, the tungsten may make contact with the barrier layer, and the aluminum may be formed on the tungsten. A drain electrode layer 8 is formed below the first conductive-type buried layer 9 of the semiconductor substrate.

As power is applied to the present semiconductor device, a channel is vertically formed between the source area 18 and the drain electrode layer 8 so that electrons move therethrough.

In preferred embodiments, the oxide layer 15 formed on the gate electrode 14 has a constant thickness (e.g., about 180±30 Å), so that performance of the semiconductor device can be efficiently maintained.

Hereinafter, a method of manufacturing the present semiconductor device will be described with reference to FIGS. 1 to 18.

Figure 1:
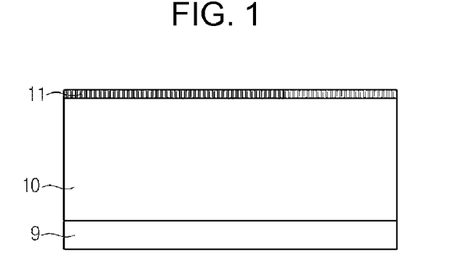
FIGS. 1 to 18 are cross-sectional views illustrating a semiconductor device and a manufacturing method thereof according to exemplary embodiments of the present invention.

Referring to FIG. 1, a hard mask layer 11 is formed on a semiconductor substrate (not shown) including a first conductive-type buried layer 9 and a first conductive-type drift area 10. In various embodiments, the hard mask layer 11 may include an oxide layer or a nitride layer.

Figure 2:
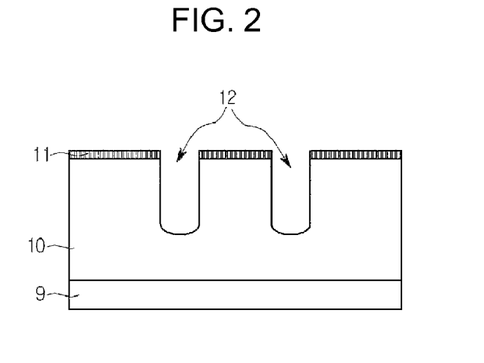

Referring to FIG. 2, a photoresist pattern (not shown) is formed on the hard mask layer 11 and is subject to an etch process to form first trenches 12 for forming gate electrodes in the first conductive-type drift area 10. In a preferred embodiment, two trenches 12 for forming two gate electrodes are formed. However, the scope of the present invention is not limited thereto. For example, one, two, or more first trenches 12 for forming the gate electrode may be formed.

Figure 3:
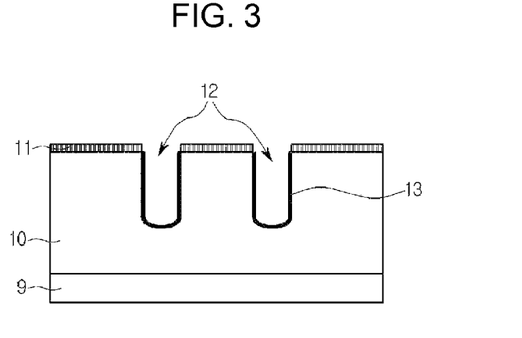

Referring to FIG. 3, an oxide layer is deposited in the first trenches 12 to form the gate insulating layer 13.

Figure 4:
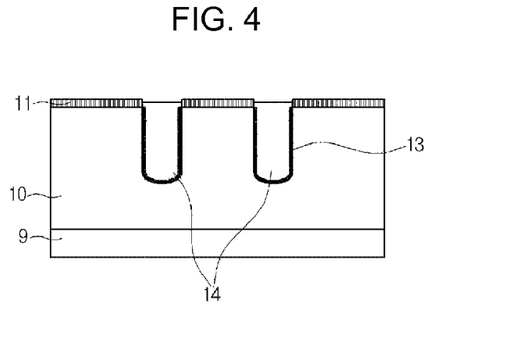

As shown in FIG. 4, polysilicon or other conductive material is deposited on the semiconductor substrate including the first trenches 12 having the gate insulating layer 13, and is etched so that the polysilicon (or other conductive material) fills the first trenches 12. Thus, the gate insulating layer 13 and the gate electrodes 14 are formed in the first trenches 12. In some embodiments, the gate electrodes may protrude outward from the first trenches.

Figure 5:
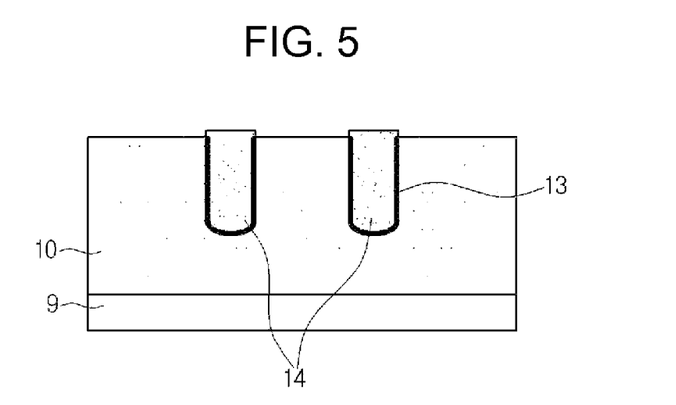

As shown in FIG. 5, the hard mask layer 11 formed on the semiconductor substrate is subsequently removed.

Figure 6:
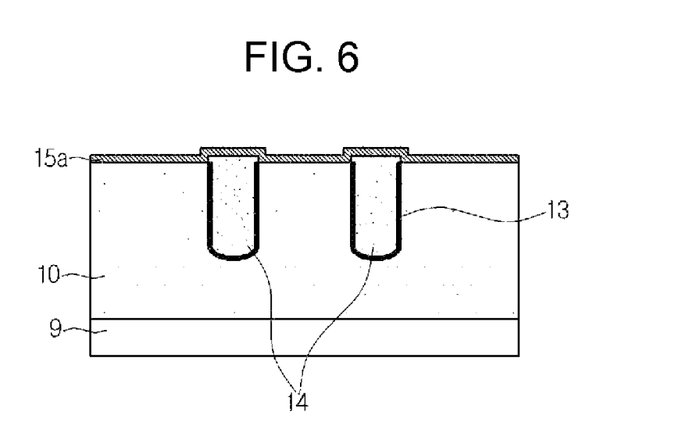

Referring to FIG. 6, the semiconductor substrate is subjected to a first heat treatment process to form an ESD (electrostatic discharge) protective circuit (not shown) on the semiconductor substrate. In the heat treatment process, a first oxide layer 15*a* is formed on the semiconductor substrate including the gate electrodes 14. In some embodiments, the first oxide layer 15*a* may have thickness of about 200 Å. The first oxide layer 15*a* insulates the gate electrodes 14 and prevents damage to the semiconductor substrate in subsequent impurity implantation processes.

Figure 7:
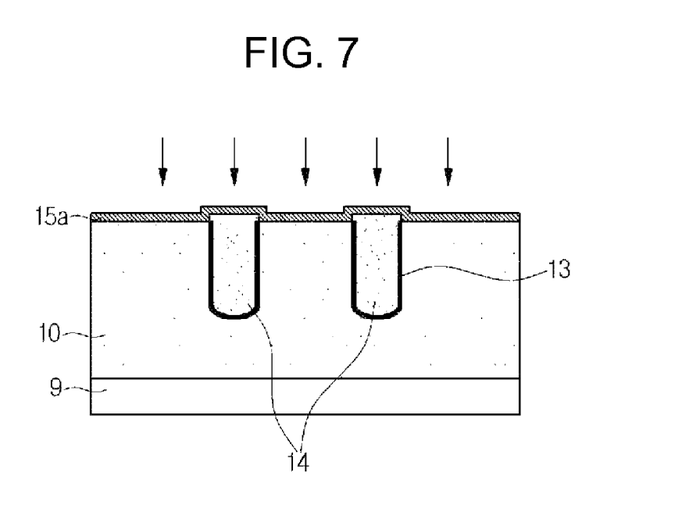

Referring to FIG. 7, second conductive-type impurity ions are implanted into the semiconductor substrate and a cleaning process is performed.

Figure 8:
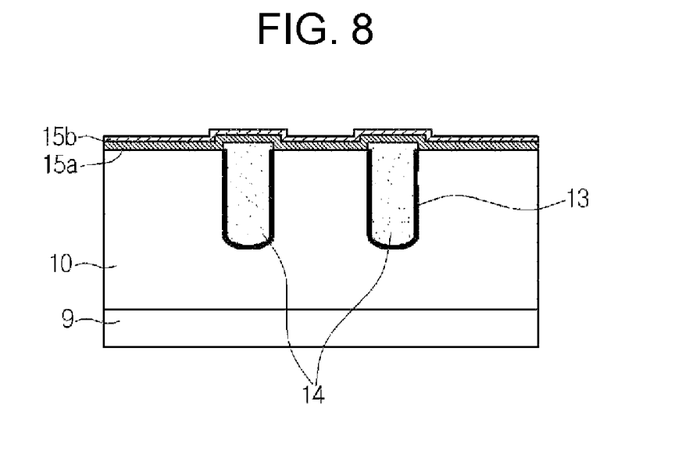

Referring to FIG. 8, a nitride layer 15*b* is formed on the first oxide layer 15*a*. The nitride layer 15*b* prevents an oxide layer from being regrown when a diffusion process for the second conductive-type impurity ions is performed on the first oxide layer 15*a*, and allows the regrown oxide layer to be easily removed if the regrown oxide layer exists. Preferably, the nitride layer 15*b* has thickness of about 50±10 Å.

Figure 9:
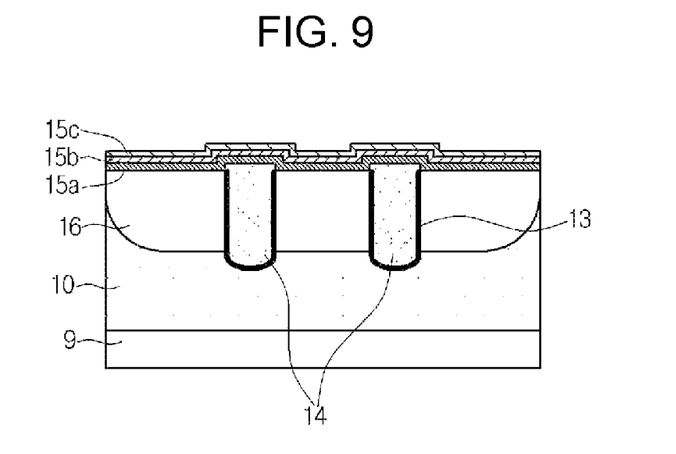

Referring to FIG. 9, the semiconductor substrate is subjected to a second heat treatment process to form the second conductive-type well 16 in which the second conductive-type impurity ions are diffused. While the diffusion process for the second conductive-type impurity ions is performed, a second oxide layer 15*c* may be formed on the nitride layer 15*b*.

The nitride layer 15*b* and the second oxide layer 15*c* formed on the gate electrodes 14 are subsequently removed.

In some embodiments, the second oxide layer 15*c* may be removed using a mixture of deionized water and HF. The nitride layer 15*b* may be removed using a phosphoric acid solution. Furthermore, in other embodiments, the second oxide layer 15*c* and the nitride layer 15*b* can be simultaneously removed using a BHF (Buffered HF) solution.

In addition, a portion of the first oxide layer 15*a* (e.g., about 20 Å) may be removed using the mixture of the deionized water and the HF. At this time, since an etch variation is about ±5 Å, the thickness of the first oxide layer 15*a* can be constantly managed.

Figure 10:
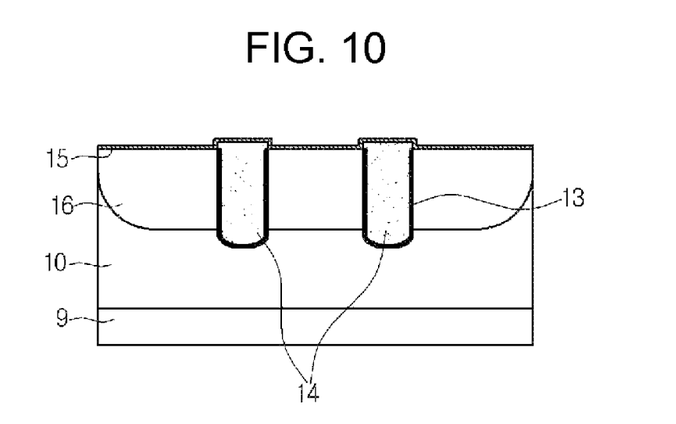

Thus, as illustrated in FIG. 10, the remaining oxide layer 15 having the efficiently designed thickness can be formed on the semiconductor substrate including the gate electrode 14. In preferred embodiments, the remaining oxide layer 15*a* has a predetermined thickness (e.g., about 180±30 Å).

Figure 11:
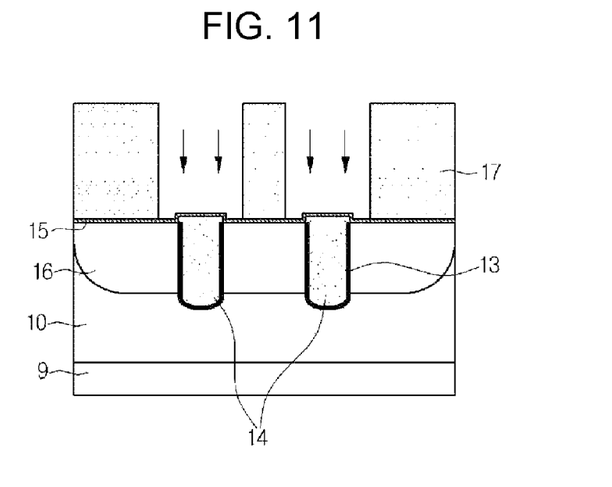
Figure 12:
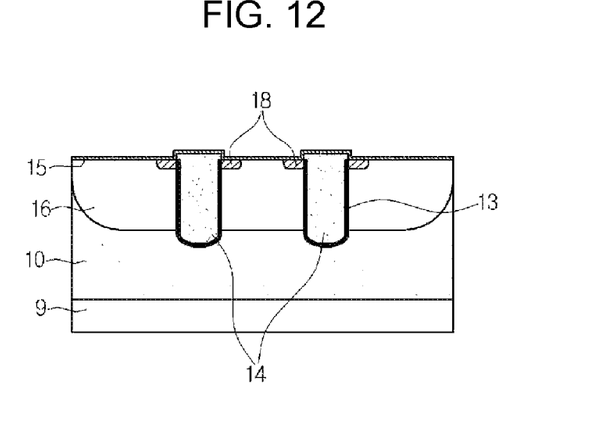

Referring now to FIGS. 11 and 12, a photoresist pattern 17 is formed on the semiconductor substrate and first conductive-type impurity ions are implanted into the semiconductor substrate. Next, the photoresist pattern 17 is removed.

Then, the semiconductor substrate is subjected to a heat treatment process to form the first conductive-type source areas 18 at sides of the gate electrode(s) 14. Preferably, the first conductive-type source areas are formed on each side of each gate electrode.

Figure 13:
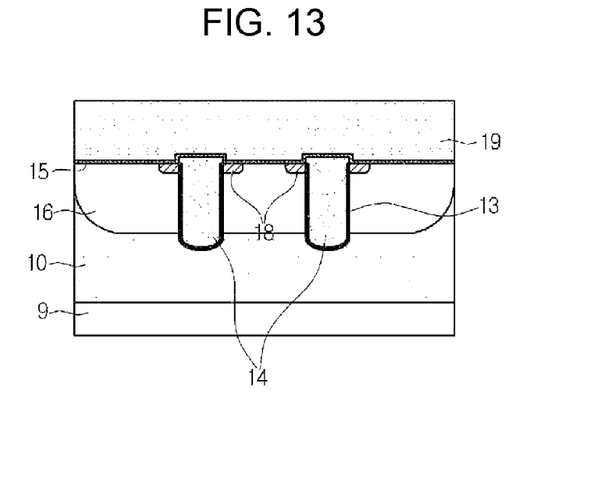
Figure 14:
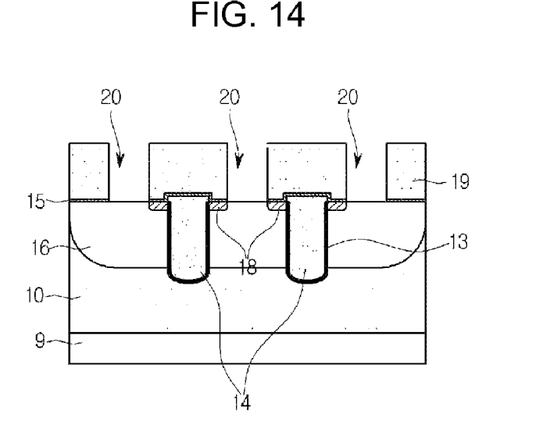
Figure 15:
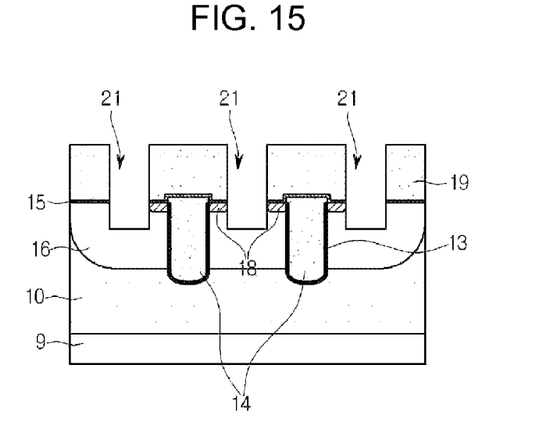

Referring to FIGS. 13 through 15, the interlayer dielectric layer 19 is formed on the semiconductor substrate and a photoresist pattern (not shown) is formed on the interlayer dielectric layer 19. In various embodiments, the interlayer dielectric layer may include silicon nitride, silicon-rich oxide (SRO), TEOS (e.g., a silicon oxide formed by CVD from tetraethylorthosilicate and oxygen), a bulk dielectric (e.g., one or more silicon oxide layers doped with fluorine or boron and/or phosphorous [FSG, BSG, PSG, and/or BPSG]), silicon dioxide, or a combination thereof. In one embodiment, the interlayer dielectric layer may comprise a relatively thick silicon oxide layer (which may be doped) on a relatively thin silicon nitride layer. Next, the interlayer dielectric layer 19 and the oxide layer 15 are selectively removed using the photoresist pattern as a mask to form second trenches 20.

Then, portions of the second conductive-type well 16 exposed by the second trenches 20 may be selectively removed using the interlayer dielectric layer 19 and the oxide layer 15 as masks to form third trenches 21.

Figure 16:
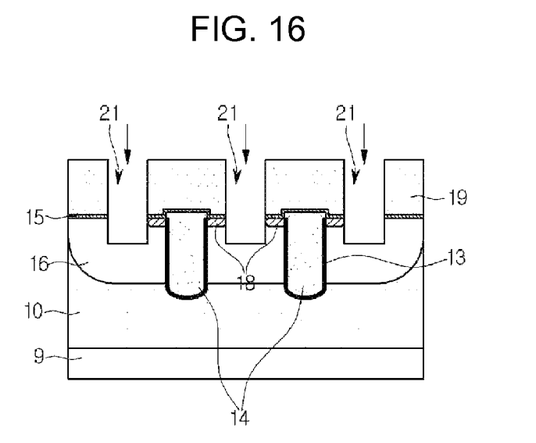

Referring to FIG. 16, the second conductive-type impurity ions are implanted into the second conductive-type well 16 exposed by the third trenches 21 to prevent current leakage.

Figure 17:
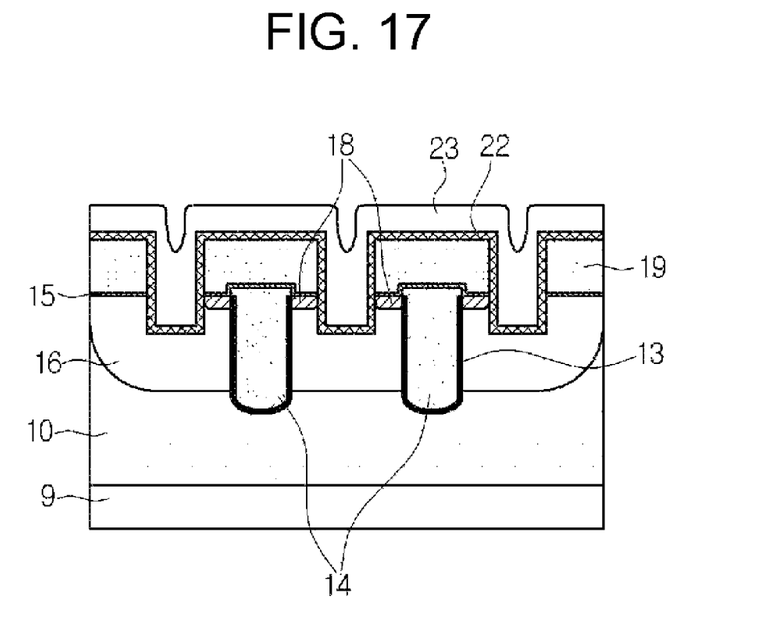

Referring to FIG. 17, a barrier layer 22 is formed on the semiconductor substrate including the third trenches 21. In some embodiments the barrier layer may comprise Ti and/or TiN (e.g., TiN-on-Ti bilayer). A first metal layer 23 (e.g., tungsten) is deposited using a CVD (chemical vapor deposition) method so that the third trenches 21 are filled. Then, the first metal layer 23 is blanket-etched. The first metal layer 23 is deposited using the CVD method under conditions that prevent voids from being formed in the third trenches 21.

Referring to FIG. 18, a second metal layer 24 having low resistance (e.g., aluminum) is deposited on the first metal layer 23, and then etched to form source contacts.

According to one exemplary embodiment, the source contacts are formed using the tungsten 23 and the aluminum 24. However, the scope of the present invention is not limited thereto. For example, the source contacts can be formed using only tungsten and/or aluminum. Alternatively, another conductive material known in the art for forming such contacts (e.g., copper) may be used.

In addition, in exemplary embodiments, the source contacts are formed in the third trenches 21. However, the scope of the present invention is not limited thereto. For example, in some embodiments, the source contacts can be formed in the semiconductor substrate without forming the third trenches.

Then, the semiconductor substrate is subjected to a passivation process and a backgrinding process to form the drain electrode 8 electrically connected with the first conductive-type buried layer 9.

Any reference in this specification to "one embodiment," "an embodiment," "exemplary embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor device, the method comprising the steps of:
    forming a first conductive-type buried layer in a semiconductor substrate and forming a first conductive-type drift area on the first conductive-type buried layer;
    forming a gate insulating layer and gate electrodes by selectively removing the first conductive-type drift area;
    forming a first oxide layer on the semiconductor substrate including the gate electrodes;
    implanting second conductive-type impurity ions into the semiconductor substrate including the first oxide layer;
    forming a nitride layer on the first oxide layer;
    forming a second conductive-type well by diffusing the second conductive-type impurity ions and simultaneously forming a second oxide layer on the nitride layer;
    removing the nitride layer and the second oxide layer from the first oxide layer;
    forming a thin oxide layer by partially removing the first oxide layer;
    forming first conductive-type source areas at sides of each gate electrode;
    forming a dielectric layer on the thin oxide layer;
    forming a trench by selectively etching the dielectric layer and the thin oxide layer;
    forming a source contact in the trench; and
    forming a drain electrode layer electrically connected with the first conductive-type buried layer.

2. The method as in claim 1, wherein the nitride layer has thickness of $50\pm10$ Å.

3. The method as in claim 1, wherein the first and/or second oxide layer is removed using a mixture of deionized water and HF.

4. The method as in claim 1, wherein the nitride layer is removed using a phosphoric acid solution.

5. The method as in claim 1, wherein the second oxide layer and the nitride layer are simultaneously removed using a BHF (Buffered HF) solution.

6. The method as in claim 1, wherein the oxide layer has a thickness of about $180\pm30$ Å.

7. The method as in claim 1, wherein the gate electrodes comprise polysilicon.

8. The method as in claim 1, wherein the first conductive-type source areas are formed on opposite sides of each gate electrode.

9. The method as in claim 1, wherein removing the first oxide layer comprises removing a partial thickness of the first oxide layer by wet etching.

10. The method as in claim 9, wherein the first oxide layer is partially removed using a mixture of deionized water and HF.

11. The method as in claim 1, wherein the source contact is formed by depositing a first metal layer using a CVD process, blanket-etching the first metal layer, and depositing a second metal layer on the blanket-etched first metal layer.

12. The method as in claim 11, wherein the first metal layer comprises tungsten and the second metal layer comprises aluminum.

* * * * *